(12) United States Patent
Yu et al.

(10) Patent No.: US 10,485,124 B2
(45) Date of Patent: Nov. 19, 2019

(54) CABLE MANAGEMENT STRUCTURE AND ROBOT

(71) Applicant: UBTECH Robotics Corp., Shenzhen (CN)

(72) Inventors: Wenhua Yu, Shenzhen (CN); Youjun Xiong, Shenzhen (CN)

(73) Assignee: UBTECH ROBOTICS CORP., Shenzhen (CN)

(*) Notice: Subject to any disclaimer, the term of this patent is extended or adjusted under 35 U.S.C. 154(b) by 267 days.

(21) Appl. No.: 15/640,583

(22) Filed: Jul. 3, 2017

(65) Prior Publication Data

US 2018/0310422 A1 Oct. 25, 2018

(30) Foreign Application Priority Data

Apr. 25, 2017 (CN) .......................... 2017 1 0274046

(51) Int. Cl.
*B25J 19/00* (2006.01)
*H05K 5/02* (2006.01)
*H05K 5/00* (2006.01)

(52) U.S. Cl.
CPC ........ *H05K 5/0247* (2013.01); *B25J 19/0029* (2013.01); *H05K 5/0017* (2013.01)

(58) Field of Classification Search
CPC . H05K 5/0247; H05K 5/0017; B25K 19/0029
See application file for complete search history.

(56) References Cited

U.S. PATENT DOCUMENTS

| | | | |
|---|---|---|---|
| 2006/0033462 A1* | 2/2006 | Moridaira | B25J 9/1674 318/568.12 |
| 2007/0192910 A1* | 8/2007 | Vu | B25J 5/007 700/245 |
| 2008/0229861 A1* | 9/2008 | Inoue | B25J 19/0029 74/490.01 |
| 2011/0010013 A1* | 1/2011 | Ruan | B25J 5/007 700/261 |
| 2012/0185096 A1* | 7/2012 | Rosenstein | B25J 11/009 700/259 |
| 2012/0196707 A1* | 8/2012 | Thoman | A63B 69/406 473/436 |
| 2017/0225336 A1* | 8/2017 | Deyle | G08B 13/196 |
| 2018/0310422 A1* | 10/2018 | Yu | H05K 5/0247 |
| 2019/0099880 A1* | 4/2019 | Niu | B25J 9/046 |

* cited by examiner

*Primary Examiner* — David M Fenstermacher

(57) ABSTRACT

A cable management structure for managing a connection cable in a robot includes a head structure, a waist structure and a base. The waist structure includes a rotating member, a rotating assembly and a fixed assembly. The rotating assembly is rotatably connected to the fixed assembly. The rotating member, the rotating assembly and the fixed assembly are coaxial. The rotating member defines a through hole. The rotating assembly is connected to the head structure and defines a passage communicating with the through hole. The fixed assembly is connected to the base. The base includes a main circuit board, and the main circuit board is located below the through hole. The connection cable includes a first end connected to the main circuit board and a second, opposite end passing through the through hole and the passage and extending into the head structure.

20 Claims, 9 Drawing Sheets

CABLE MANAGEMENT STRUCTURE AND ROBOT

CROSS REFERENCE TO RELATED APPLICATIONS

This application claims priority to Chinese Patent Application No. 201710274046.6, filed Apr. 25, 2017, which is hereby incorporated by reference herein as if set forth in its entirety.

BACKGROUND

1. Technical Field

The present disclosure generally relates to the field of robotics, and particularly to a cable management structure and a robot.

2. Description of Related Art

A robot can perform various actions by controlling servos at different joints. It needs to connect servos, circuit boards and the power supply through cables. For some conventional robots, there are no dedicated cable routing structures, which may cause the cables to be tangled when the robots performs actions. This situation is particularly evident in the waist structure and the head structure of the robots. Since the waist structure and the head structure are usually designed to be rotatable in a wide range, and many cables are connected to the electrical components within the waist structure and the head structure, the rotation of the waist structure/head structure tends to cause the cables to be tangled, which may affect adversely the operation of the robots.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

Figure 1:
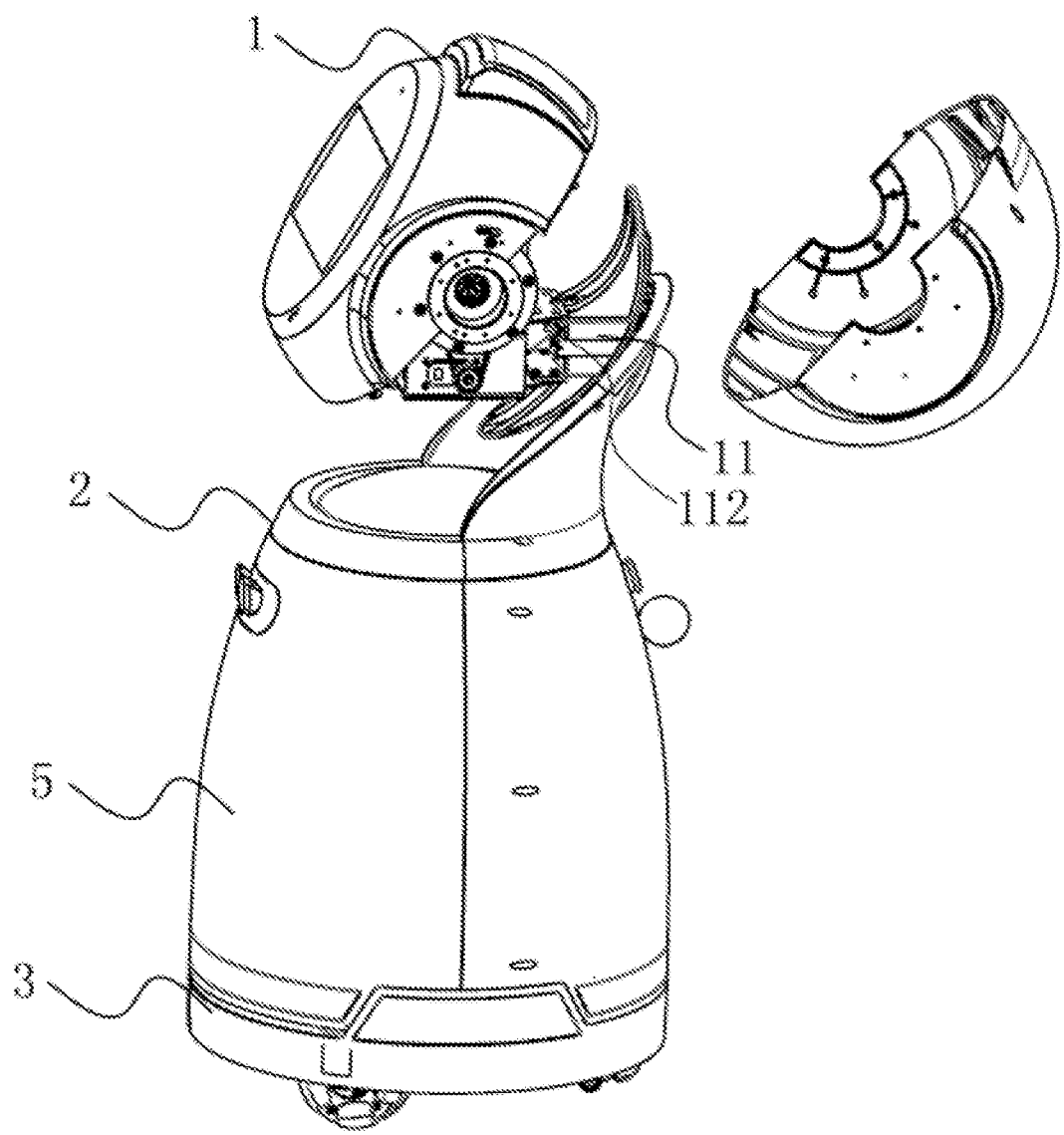
FIG. 1 is an isometric partially exploded view of a robot according to one embodiment.
Figure 2:
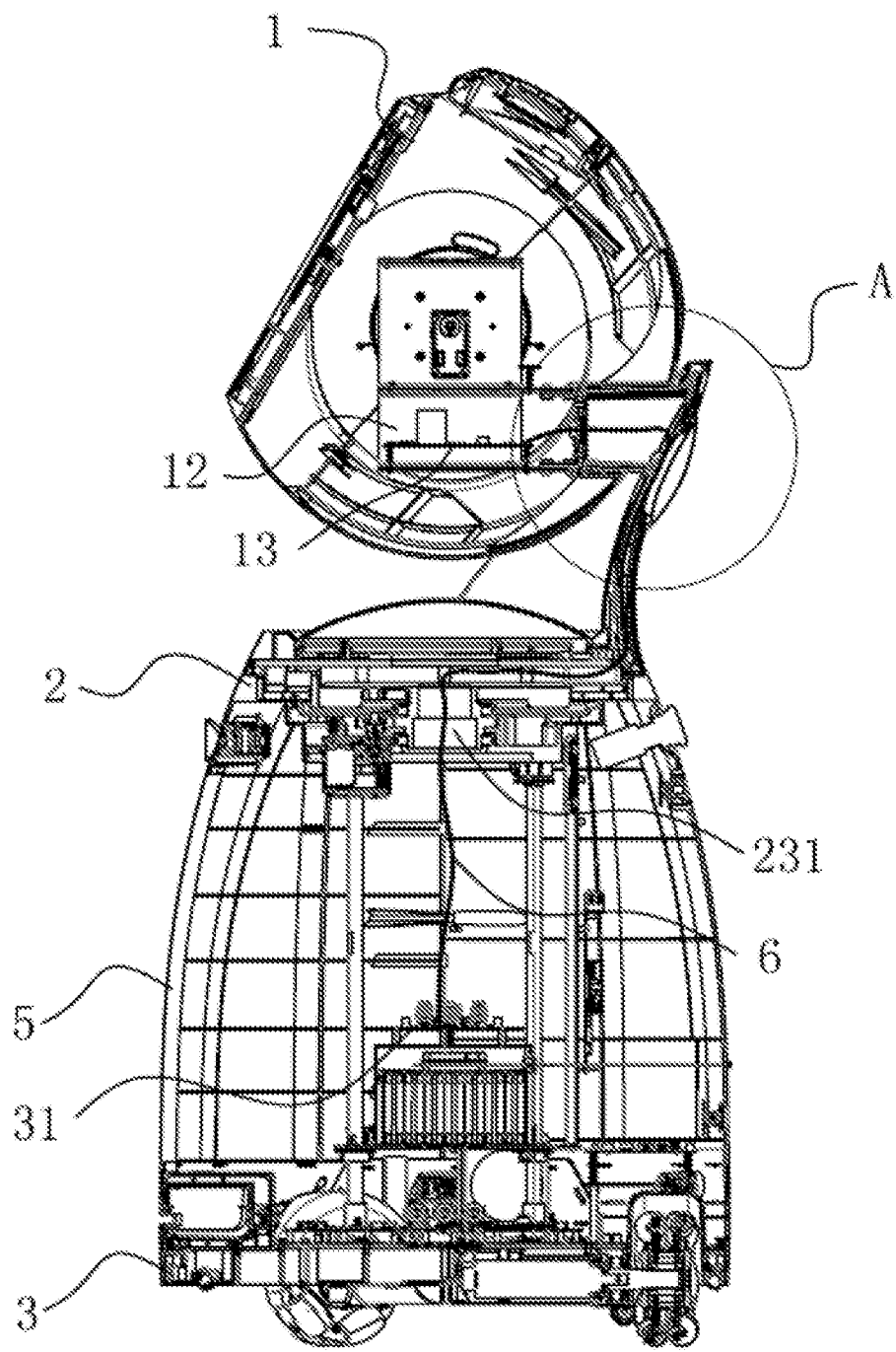
FIG. 2 is a sectional view of a robot according to one embodiment.

The embodiment(s) of the present disclosure will be described in detail. The examples of the embodiment(s) are shown in the drawings, throughout which the same or similar reference numerals denote the same or similar elements or elements having the same or similar functions. The following embodiments described by making reference to the drawings are exemplary, aim to explain the present disclosure, and are not to be construed as limiting the present disclosure.

In the descriptions of the present disclosure, it should be understood that orientations or positions denoted by the terms "length", "width", "upper", "lower", "front", "left", "right", "upright", "horizontal", "top", "bottom", "inner" and "outer" are based on the orientations or positions shown in the drawings, are used for the ease of describing the present disclosure and simplifying descriptions, and are not to denote or imply that the denoted device(s) or element(s) necessarily has specific orientations and are constructed and operated in specific orientations. The terms are thus not to be construed as limiting the present disclosure.

In the present disclosure, unless otherwise explicitly defined and limited, the terms "mount", "connect", "join" and "fix" should be broadly understood. For example, they may refer to a fixed connection, a detachable connection or an integrally formation. They may refer to a mechanical connection or an electrical connection. They may refer to a direct connection or an indirect connection via an intermediate medium. They may refer to a communication of the interiors of two elements or an interaction relationship. To those having ordinary skill in the art, the meaning of the aforementioned terms in the present disclosure may be understood according to specific circumstances.

Referring to FIGS. 1-5, a cable management structure for managing a cable 6 in a robot includes a head structure 1, a waist structure 2 and a base 3.

The waist structure 2 includes a rotating member 23, a rotating assembly 21 and a fixed assembly 22. The rotating assembly 21 is rotatably connected to the fixed assembly 22. The rotating member 23, the rotating assembly 21 and the fixed assembly 22 are coaxial. The rotating member 23 defines a through hole 231. The rotating assembly 21 is connected to the head structure 1 and can thus drive the head structure 1 to rotate. The rotating assembly 21 defines a passage communicating with the through hole 231.

The base 3 includes a main circuit board 31 that includes a power supply circuit board and a control circuit board. The power supply circuit board provides power to components of the robot, such as servos, a light source, a camera, an acoustic source device, etc. The control circuit board is used for transmitting signals between components and their corresponding circuit boards so as to achieve the control of the robot.

The fixed assembly 22 is connected to the base 3, and the main circuit board 31 of the base 3 is located below the through hole 231.

The connection cable 6 includes a first end connected to the main circuit board 31 and a second, opposite end passing through the through hole 231 and the passage and extending into the head structure 1. The opposite end is connected to the component in the head structure 1.

The connection cable 6 extending out of the head structure 1 passes through the passage of the rotating assembly 21 and through hole 231 of the rotating assembly 23 and is connected to the main circuit board 31 of the base 3. Since the rotating assembly 21, the fixed assembly 22 and the rotating member 23 are coaxial, and the main circuit board 31 is located below the through hole 231, the cable 6 will be slightly twisted, but not become tangled when the rotating assembly 21 rotates with respect to the fixed assembly 22.

Thus, redundancy can be achieved by the cable 6 with a small redundant length to make sure that no failure will happen even when the cable 6 is twisted. In one embodiment, the main circuit board 31 is located right under the through hole 231. In this case, the redundant length for achieving the redundancy is the smallest.

It is to be noted that the connection cable 6 may include a power supply line and a signal line, and the signal line may be a video signal line or an audio signal line or a network signal line. The connection cable 6 may be a single line or a bunch of lines.

Figure 4:
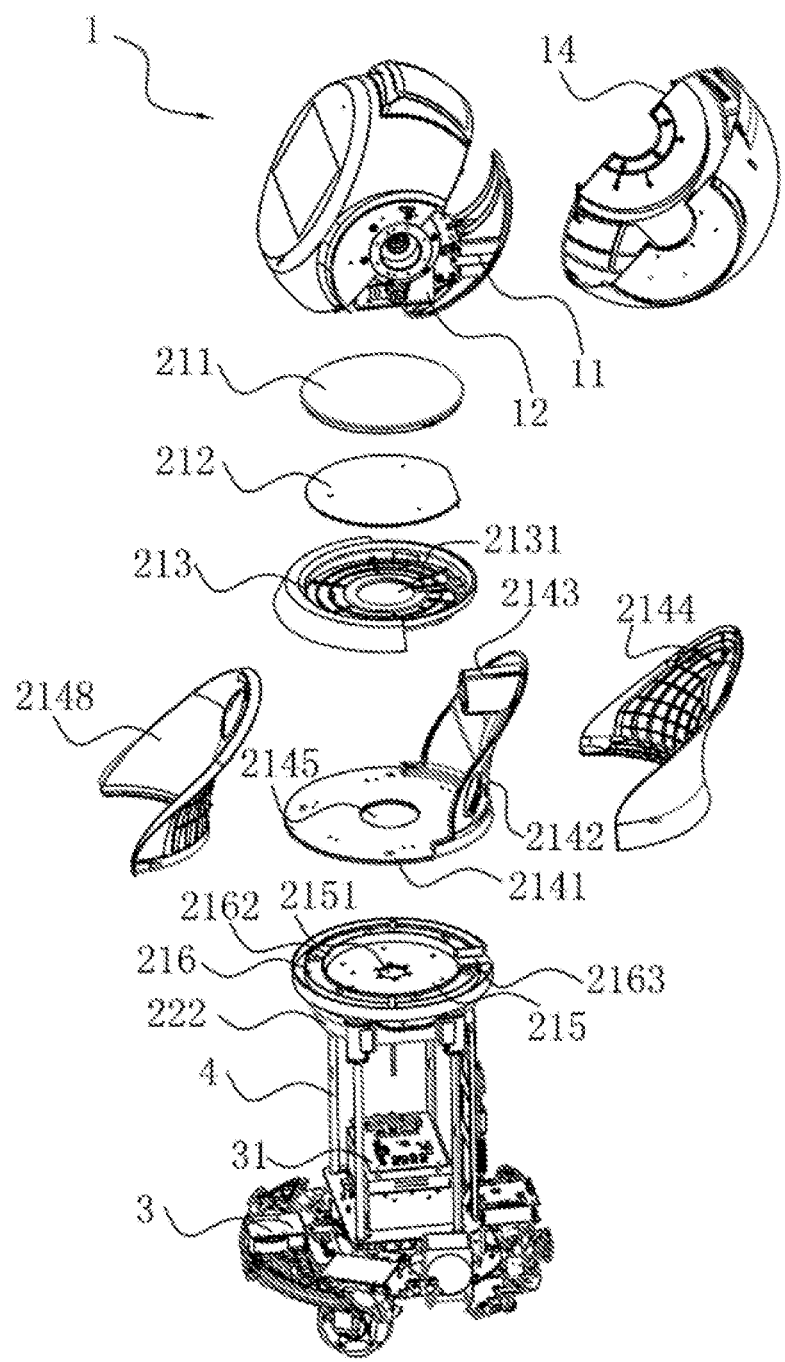
FIG. 4 is an isometric exploded view of a robot according to one embodiment.
Figure 5:
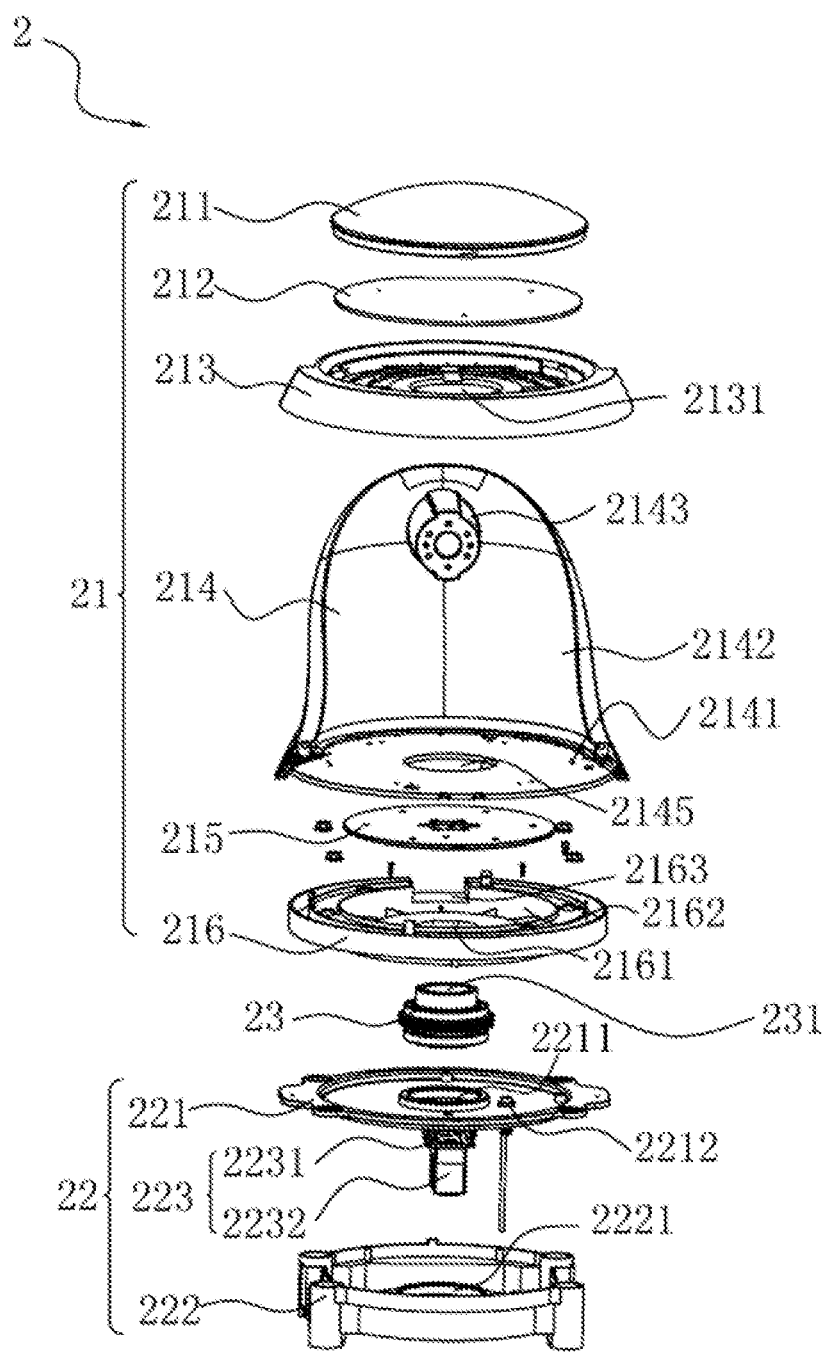
FIG. 5 is an isometric exploded view of a rotating assembly and a fixed assembly of a robot according to one embodiment.

Referring to FIGS. 4-5, in one embodiment, the rotating assembly 21 includes a support 214 and a rotary disc 216. The rotary disc 216 defines a first cable hole 2161, and a top of the rotating member 23 is fixedly connected to the rotary disc 216. The through hole 231 communicates with the first cable hole 2161. Specifically, the top of the rotary disc 216 defines a receiving space 2162 and a metal plate 215 is arranged in the receiving space 2162. The metal plate 215 defines a fourth cable hole 2151 in a center thereof, and a number of threaded holes around the fourth cable hole 2151. The fourth cable hole 2151 and the first cable hole 2161 are coaxial. The top of the rotating member 23 defines a number of second threaded holes 2352. The lateral surface of the rotating member 23 includes a planar surface that is adjacent to the top of the rotating member 23 and is substantially parallel to the axis of the rotating member 23. The inner lateral surface of the first cable hole 2161 includes a planar surface that matches with the planar surface of the rotating member 23. The top of the rotating member 23 passes through the first cable hole 2161 and the planar surface 2351 contact the planar surface of the first cable hole 2161 so as to prevent the rotating member 23 from rotating with respect to the rotary disc 216. The metal plate 215 is fixed to the top of the rotating member by screws passing through the first threaded holes and the second threaded holes. The rotary disc 216 is thus located between the metal disc 215 and the rotating member 23.

The support 214 includes a connection disc 2141 and a support panel 2142. The connection disc 2141 is connected to and covers the top of the rotary disc 216, and the support panel 2142 is connected to a top of the connection disc 2141 at an edge thereof. The support panel 2142 is curved, it is to be understood that the support panel 2142 may be of other shapes, such as a flat panel.

The top of the rotary disc 216 defines a first cable groove 2163. One end of the first cable groove 2163 communicates with the through hole 231, and an opposite end of the first cable groove 2163 extends to the lateral surface of the rotary disc 216. The connection disc 2141 covers the top opening of the first cable groove 2163.

Referring to FIGS. 4-7, a side surface of the support panel 2142 defines a second cable groove 2146, and an opposite side of the support panel 2142 includes a connection portion 2143 protruding therefrom. The connection portion 2143 is configured to be hollow to form a third cable groove 2147, and opposite ends of the second cable groove 2146 communicate respectively with the first cable groove 2163 and the third cable groove 2147, forming the passage of the rotating assembly.

Grooves are defined in different components of the rotating assembly 21. The connection cable 6 can be guided through the passage formed by the first cable groove 2163, the second cable groove 2146, and the third cable groove 2147 that allows the connection cable 6 to pass therethrough, thereby preventing the cable 6 from becoming messy and tangled. On the other hand, it facilitates the installing/removing of the cable 6 by way of the passage formed by the grooves. It should be noted that the above passage is only a preferred embodiment, and in other embodiments, passages of other structures may be created according to actual need.

A first decoration panel 2148 is arranged to cover the side surface of the support panel 2142 where the connection portion 2143 is located, and a second decoration panel 2144 is arranged to cover the side surface of the support panel 2142 where the second cable groove 2146 is formed. The second cable groove 2146 is covered by the second decoration panel 2144, thereby forming a passage at the rotating assembly 21.

Figure 3:
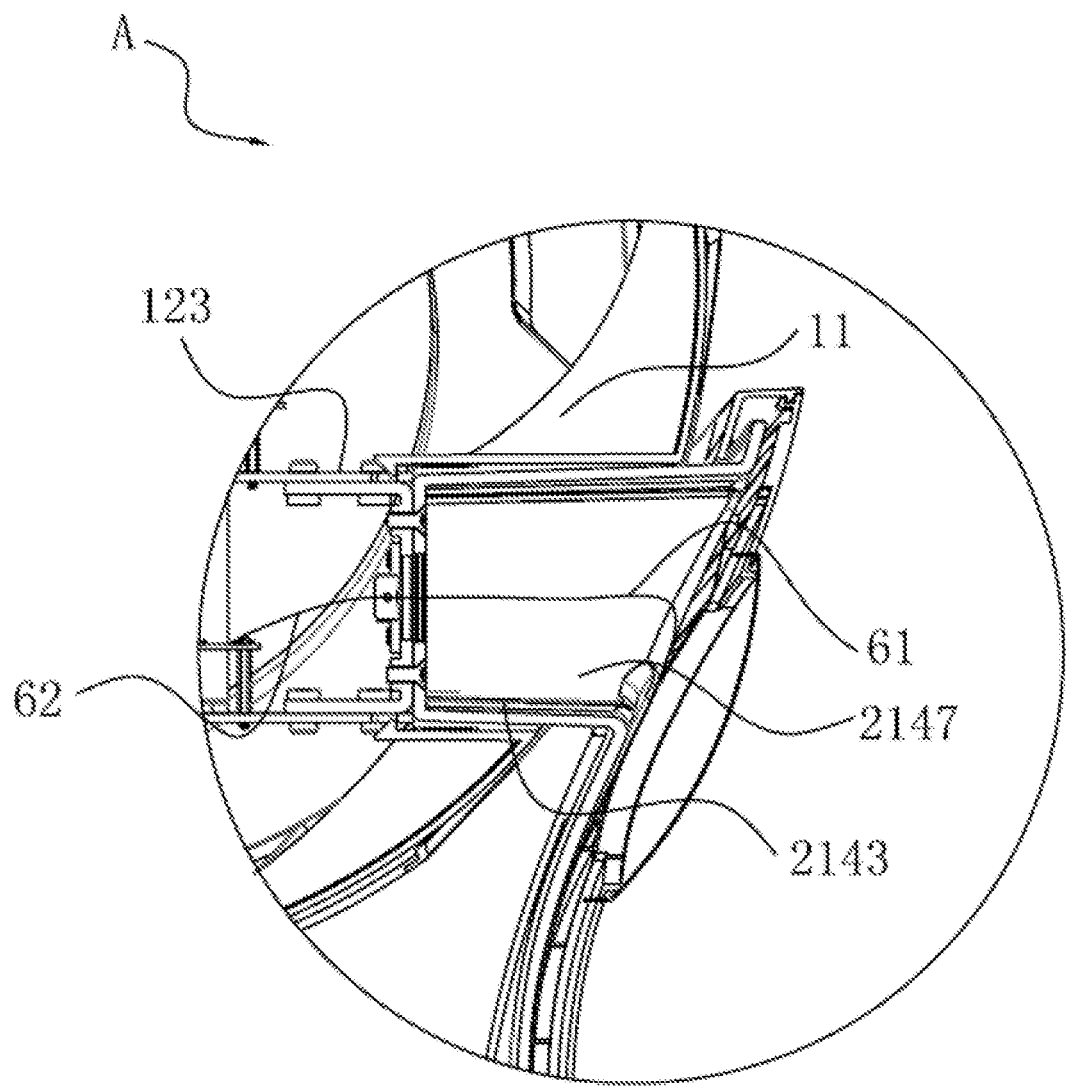
FIG. 3 is an enlarged view of the portion A of FIG. 2.

Referring to FIGS. 3-4, the cable 6 includes a first cable section 61, a second cable section 62, a first connecting terminal and a second connecting terminal. The first connecting terminal and the second connecting terminal are electrically and detachably connected to each other. One end of the second cable section 62 is electrically connected to the first connecting terminal, and an opposite end of the second cable section 62 extends into the head structure 1. One end of the first cable section 61 is connected to the main circuit board 31, and an opposite end of the first cable section 61 passes through the through hole 231 and the passage and is connected to the second connecting terminal. The first connecting terminal and the second connecting terminal are located within the third cable groove.

The first connecting terminal and the second connecting terminal may be provided in the form of a male and a female connection connectors, or may be provided in the form of two metal pins.

The connection cable 6 is divided into the first cable section 61 and the second cable section 62 by the first connecting terminal and the second connecting terminal, and the first cable section 61 is located at the waist structure 2 and the base 3 and the second cable section 6 is located in the head structure 1, which facilitates the disassembling of the robot. For example, since the first connecting terminal and the second terminal can be detached from each other, the head structure 1 can be easily detached from the robot without being affected by the connection cable 6.

Figure 8:
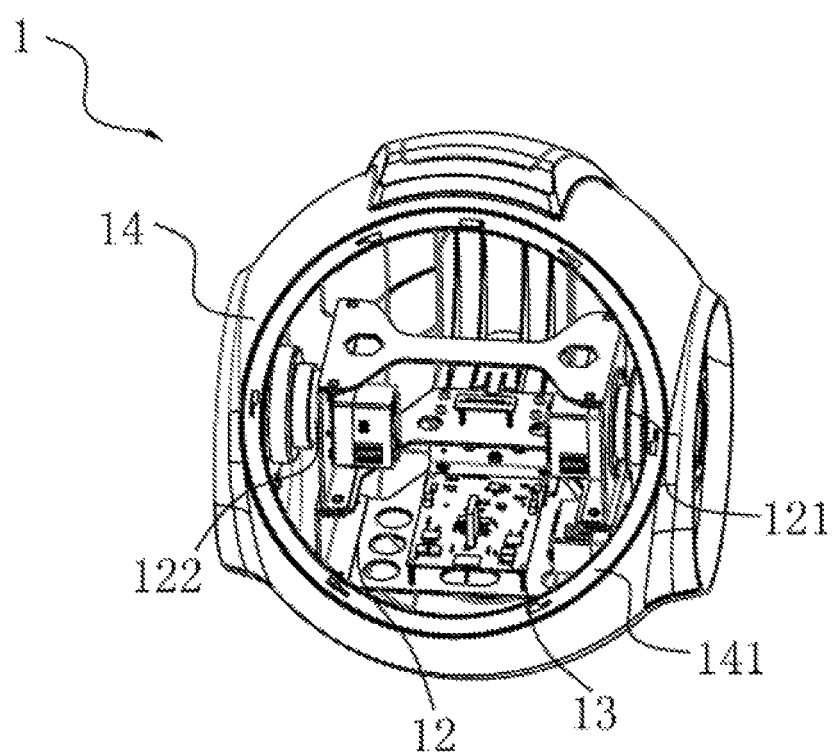
FIG. 8 shows the internal structure of a head structure of a robot according to one embodiment.

Referring to FIG. 8, the head structure 1 includes a fixing frame 12 and a housing 14. The fixing frame 12 is located within the housing 14, and includes a mounting portion 123 for connecting with the connection portion 2143. The housing 14 defines an opening that allows the connection portion 2143 to be inserted thereinto such that the connection portion 2143 can be connected to the mounting portion 123. A shielding member 11 is connected to the mounting portion 123 and covers the opening. The housing 14 is rotatable with respect to the fixing frame 12. Specifically, the fixing frame 12 includes a first shaft 121 and a second shaft 122 that are coaxial with each other. The housing 14 includes a first flange 15 and a second flange. The first shaft 121 and the first flange 15 are rotatably connected to each other. The second shaft 122 and the second flange are rotatably connected to each other. The housing 14 can then rotate upward/downward around the first and second shafts 121 and 122.

In one embodiment, the fixing frame 12 includes a number of servos for respectively controlling the rotation of the housing 14 and the movement of the arms of the robot. The fixing frame 12 includes a first circuit board 13 that is configured to control the servos. Plural cables 6 are needed. The end of at least one second cable section 62 that extends into the head structure 1 is connected to the first circuit board 13.

The fixing frame 12 is stationary with respect to the rotating assembly 21. The connection cable 6 is guided into the head structure 1 from the fixing frame 12 so that interference of the connection cable 6 with the housing 14 during the rotation of the housing 14 can be effectively avoided.

Figure 9:
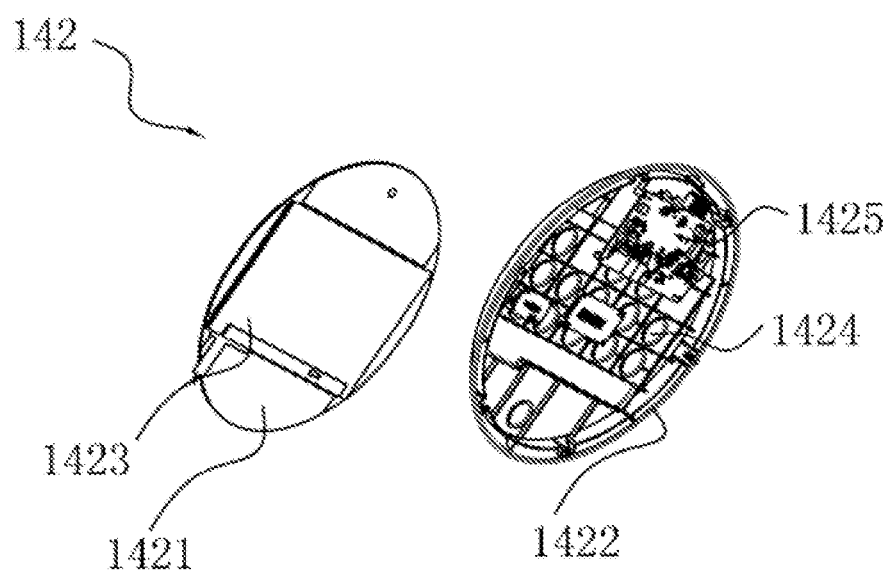
FIG. 9 is an isometric exploded view of a cover of a head of a robot according to one embodiment.

Referring to FIGS. 8-9, the housing 14 defines an opening 141 and includes a cover 142 that covers the opening 141. The cover 142 includes an outer disc 1421 and an inner disc 1422. The outer disc 1421 is connected to the side of the inner disc 1422 that faces away from the opening 141, and includes a display 1423 mounted thereon. The inner disc 1422 defines plural heat dissipating holes 1424 for the dissipating the heat from the display 1423, and includes a camera and a second circuit board 1425 arranged thereon for controlling the display 1423 and the camera. The end of at least one second cable section 62 that extends into the head structure 1 is connected to the second circuit board 1425.

Referring to FIGS. 4-5, the rotating assembly 21 further includes a light emitting assembly that includes a light shield 211, a light plate 212, a connection wire and a base member 213. The light plate 212 is arranged between the base member 213 and the light shield 211. The light shield 211 includes a hook at a bottom thereof. The base member 213 includes a hook receiver that can be engaged with the hook of the light shield 211, thereby connecting the light guide 211 to the base member 231.

The light plate 212 is a plastic circuit board and includes a number of light-emitting diodes (LEDs) of different colors. The LEDs can emit light of different colors or light of different intensity according to different control signals. The base member 213 defines a second cable hole 2131, and the connection disc 2141 defines a third cable hole 2145. The base member 213 is arranged on a top of the connection disc 2141. The first cable hole 2161, the second cable hole 2131 and the third cable hole 2145 are coaxial and communicate with each other. One end of the connection wire is connected to the light plate 212, and an opposite end of the connection wire passes through the second cable hole 2131, the third cable hole 2145 and the first cable hole 2161 and is connected to the main circuit board 31.

Figure 6:
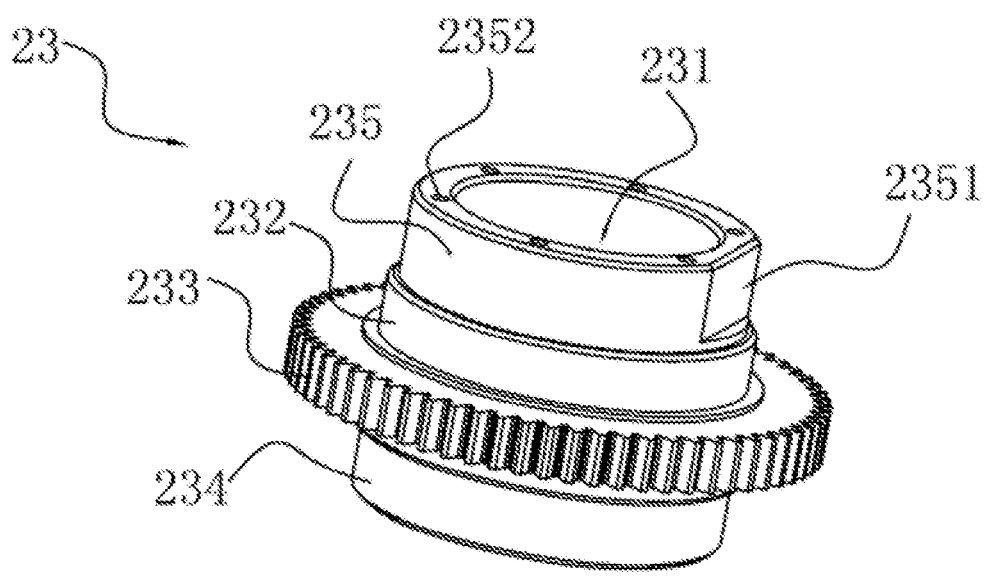
FIG. 6 is an isometric view of a rotating member of a robot according to one embodiment.
Figure 7:
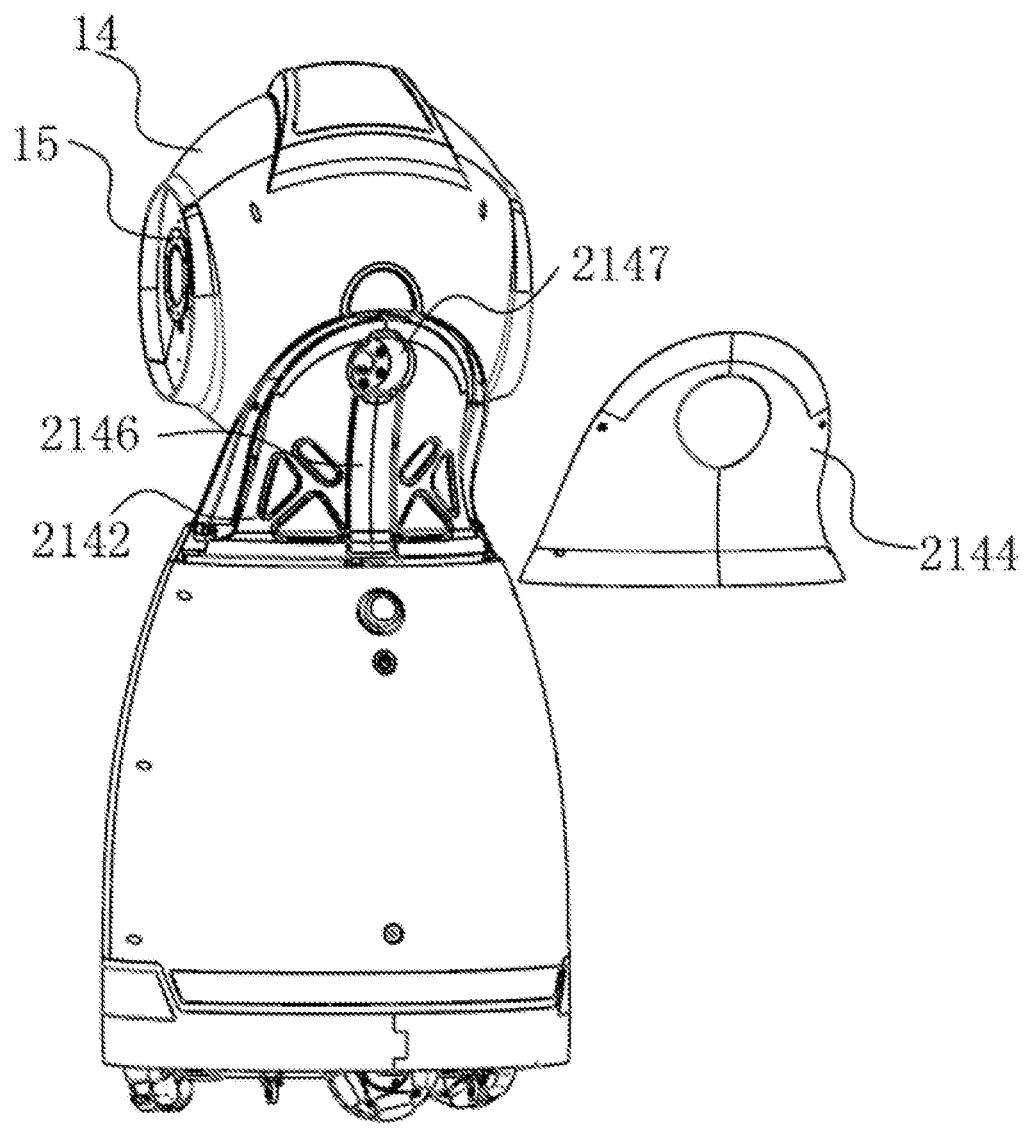
FIG. 7 is shows the back of a robot according to one embodiment, with one component detached from the back.

Referring to FIGS. 4-6, the fixed assembly 22 includes a mounting plate 221 and an auxiliary support 222. The mounting plate 221 is connected to a top of the auxiliary support 222. The auxiliary support 222 includes a number of support posts 4 connected to the base 3. A casing 5 extends from the rim of the auxiliary support 222 to the rim of the base 3. The mounting plate 221 defines a first connection hole 2211, and the auxiliary support 222 defines a second connection hole 2221. The rotating member 23 includes a cylindrical body 235, a first bearing 232 and a second bearing 234. The through hole 231 is located at the center of the cylindrical body 235. The top of the cylindrical body 235 is fixedly connected to the rotating assembly 21. The inner ring of the first bearing 232 is interference fit with the cylindrical body 235, and the outer ring of the first bearing 232 is interference fit with the first connection hole 2211. The inner ring of the second bearing 234 is interference fit with the cylindrical body 235, and the outer ring of the second bearing 234 is interference fit with the second connection hole 2221, thereby enabling the rotating member 23 to rotate with respect to the fixed assembly 22.

The mounting plate 221 is includes a position sensor 2212 for detecting the position of the rotating assembly 21 and the fixed assembly 22. The bottom of the rotary disc 216 includes a metal block (not shown) that can be detected by the position sensor 2212 when the metal block rotates together with the rotary disc to a position correspond to the position of the position sensor 2212. In this way, it can determine if the rotary disc 216 has returned to its initial position.

The waist structure 2 further includes a driving assembly 223 that is configured to drive the rotating assembly 21 to rotate with respect to the fixed assembly 22. The driving assembly 223 is arranged between the mounting plate 221 and the auxiliary support 222, and includes a drive gear 2231 and a drive device 2232 configured to drive the drive gear 2231 to rotate. The driving device 2232 is a servo. The rotating member 23 includes an outer gear section 233 that is engaged with the drive gear 2231 and arranged between the first bearing 232 and the second bearing 234. The drive device 2232 drives the drive gear 2231 to rotate, and the drive gear 2231 then drives the rotating member 23 to rotate. The rotating member 23 then drives the rotating assembly 21 to rotate.

The present disclosure further provides a robot that includes a cable management structure of any one of the above embodiments, which will not be repeated here.

Although the features and elements of the present disclosure are described as embodiments in particular combinations, each feature or element can be used alone or in other various combinations within the principles of the present disclosure to the full extent indicated by the broad general meaning of the terms in which the appended claims are expressed.

What is claimed is:

1. A cable management structure for managing a connection cable in a robot, comprising a head structure, a waist structure and a base wherein:

the waist structure comprises a rotating member, a rotating assembly and a fixed assembly, the rotating assembly is rotatably connected to the fixed assembly, the rotating member, the rotating assembly and the fixed assembly are coaxial, the rotating member defines a through hole, the rotating assembly is connected to the head structure and defines a passage communicating with the through hole;

the fixed assembly is connected to the base, the base comprises a main circuit board, and the main circuit board is located below the through hole; and the connection cable comprises a first end connected to the main circuit board and a second, opposite end passing through the through hole and the passage and extending into the head structure; and wherein the rotating assembly, comprises a support and a rotary disc, the rotary disc defines a first cable hole, a top of the rotating member is fixedly connected to the rotary disc, the through hole communicates with the first cable hole, the support comprises a connection disc and a support panel, connection disc is connected to a top of the rotary disc, and the support panel is connected to a top of the connection disc.

2. The cable management structure of claim 1, wherein the top of the rotary disc defines a first cable groove, one end of the first cable groove communicates with the through hole, and an opposite end of the first cable groove extends to a lateral surface of the rotary disc;

a side surface of the support panel defines a second cable groove, and an opposite side of the support panel comprises a connection portion protruding therefrom; and the connection portion is configured to be hollow to form a third cable groove, and opposite, ends of the second cable groove communicate respectively with the first cable groove and the third cable groove, forming the passage.

3. The cable management structure of claim 2, wherein a first decoration panel is arranged to cover the side surface of the support panel where the connection portion is located, and a second decoration panel is arranged to cover the side surface of the support panel where the second cable groove is formed.

4. The cable management structure of claim 2, wherein the cable comprises a first cable section, a second cable section, a first connecting terminal and a second connecting terminal, the first connecting terminal and the second connecting terminal are electrically and detachably connected to each other, one end of the second cable section is electrically connected to the first connecting terminal, and an opposite end of the second cable section extends into the head structure, one end of the first cable section is connected to the main circuit board, and an opposite end of the first cable section passes through the through hole and the passage and is connected to the second connecting terminal, and the first connecting terminal and the second connecting terminal are located within the third cable groove.

5. The cable management structure of claim 4, wherein the head structure comprises a fixing frame and a housing, the fixing frame is located within the housing, the fixing frame comprises a mounting portion for connecting with the connection portion, the housing defines an opening that allows the connection portion to be inserted thereinto such that the connection portion can be, connected to the mounting portion, a shielding member is connected to the mounting portion and configured to cover the opening, the housing is rotatable with respect to the fixing frame, the fixing frame comprises a first circuit board that is configured to control a servo, the end of the second cable section that extends into the head structure is connected to the first circuit board.

6. The cable management structure of claim 5, wherein the housing comprises a display and camera arranged thereto and a second circuit board arranged therein for controlling the display and the camera, and the end of the second cable section that extends into the head structure is connected to the second circuit board.

7. The cable management structure of claim 1, wherein the rotating assembly thither comprises a light emitting, assembly that comprises a light shield, a light plate, a connection wire and a base member, the light plate is arranged between the base member and the light shield, the base member defines a second cable hole, the connection disc defines a third cable hole, the base member is arranged on a top of the connection disc, the first cable hole, the second cable hole and the third cable hole are coaxial, one end of the connection wire is connected to the light plate, and an opposite end of the connection wire passes through the second cable bole, the third cable hole and the first cable hole and is connected to the main circuit board.

8. The cable management structure of claim 1, wherein the fixed assembly comprises a mounting plate and an auxiliary support, the mounting plate is connected to a top of the auxiliary support, the mounting plate defines a first connection hole, the auxiliary support defines a second connection hole, the rotating member comprises a cylindrical body, a first bearing and a second bearing, a top of the cylindrical body is fixedly connected to the rotating assembly, an inner ring of the first hearing is interference fit with the cylindrical, body, an outer ring of the first bearing is interference fit with the first connection hole, an inner ring of the second hearing is interference fit with the cylindrical body, and an outer ring of the second bearing is interference fit with the second connection hole.

9. The cable management structure of claim 1, wherein the waist structure further comprises a driving assembly that is configured to drive the rotating assembly to rotate with respect to the fixed assembly, the driving assembly is arranged between the mounting plate and the auxiliary support, and comprises a drive gear and a drive device configured to drive the drive gear to rotate, and the rotating member comprises an outer gear section that is engaged with the drive gear.

10. A robot comprising a cable management structure for managing a connection cable in a robot, the cable management structure comprising a head structure, a waist structure and a base; wherein:
the waist structure comprises a rotating member, a rotating assembly and a fixed assembly, the rotating assembly is rotatably connected to the fixed assembly, the rotating member, the rotating assembly and the fixed assembly are coaxial, the rotating member defines a through hole, the rotating assembly is connected to the head structure and defines a passage communicating with the through hole;
the fixed assembly is connected to the base, the base comprises a main circuit board, and the main circuit board is located below the through hole; and
the connection cable comprises a first end connected to the main circuit board and, a second, opposite end passing through the through hole and the passage and extending into the head structure; and
wherein the rotating assembly comprises a support and a rotary disc, the rotary disc defines a first cable hole, a top of the rotating member is fixedly connected to the rotary disc, the through support panel, the connection disc is connected to a top of the rotary disc, and the support panel is connected to a top of the connection disc.

11. A cable management structure for managing a connection cable in a robot, comprising:
a waist structure comprising a rotating, assembly, a fixed assembly and a rotating member connected between the rotating assembly and the fixed assembly, the rotating assembly being rotatable about a rotation axis with respect to the fixed assembly via the rotating member, the rotating member defining a through, hole extending along the rotation axis, the rotating assembly defining a passage therein and having a lower end defining an opening through which the passage and the through hole are communicated with each other;
a head structure connected to the rotating assembly,
a base connected to the fixed assembly, and comprising a main circuit boar located below the through hole; and
a connection cable extending within the through hole and the passage and comprising a first end connected to the main circuit hoard and a second, opposite end connected to the head structure.

12. The cable management structure of claim 11, wherein the rotating assembly comprises a support and a rotary disc, the rotary disc defines a first cable hole, a top of the rotating member is fixedly connected to the, rotary disc, the through hole communicates with the first cable hole, the support comprises a connection disc and a support panel, the connection disc is connected to a top of the rotary disc, and the support panel is connected to a top of the connection disc.

13. The cable management structure of claim 12, wherein the top of the rotary disc defines a first cable groove, one end of the first cable groove communicates with the through hole, and an opposite end of the first cable groove extends to a lateral surface of the rotary disc;

a side surface of the support panel defines a second cable groove, and an opposite side of the support panel comprises a connection portion protruding therefrom; and the connection portion is configured to be hollow to form a third cable groove, and opposite ends of the second cable groove communicate respectively with the first cable groove and the third cable groove, forming the passage.

14. The cable management structure of claim 13, wherein a first decoration panel is arranged to cover the side surface of the support panel where the connection portion is located, and a second decoration panel is arranged to cover the side surface of the support panel where the second cable groove is formed.

15. The cable management structure of claim 13, wherein the cable comprises a first cable section, a second cable section, a first connecting terminal and a second connecting terminal, the first connecting terminal and the second connecting terminal are electrically and detachably connected to each other, one end of the second cable section is electrically connected to the first connecting terminal, and an opposite end of the second cable section extends into the head structure, one end of the first cable section is connected to the main circuit hoard, and an opposite end of the first cable section passes through the through hole and the passage and is connected to the second connecting terminal, and the first connecting terminal and the second connecting terminal are located within the third cable groove.

16. The cable management structure of claim 15, wherein the head structure comprises a fixing frame and a housing, the fixing frame is located within the housing, the fixing frame comprises a mounting portion for connecting with the connection portion, the housing defines an opening that allows the connection portion to be inserted thereinto such that the connection portion can be connected to the mounting portion, a shielding member is connected to the mounting portion and configured to cover the opening, the housing is rotatable with respect to the fixing frame, the fixing frame comprises a first circuit board that is configured to control a servo, the end of the second cable section that extends into the head structure is connected to the first circuit board.

17. The cable management structure of claim 16, wherein the housing comprises a display and camera arranged thereto and a second circuit board arranged therein for controlling the display and the camera, and the end of the second cable section that extends into the head structure is connected to the second circuit board.

18. The cable management structure of claim 12, wherein the rotating assembly further comprises a light emitting assembly that comprises a light shield, a light plate, a connection wire and a base member, the light plate is arranged between the base, member and the light shield, the base member defines a second cable hole, the connection disc defines a third cable hole, the base member is arranged on a top of the connection disc, the first cable hole, the second cable hole and the third cable hole are coaxial, one end of the connection wire is connected to the light plate, and an opposite end of the connection wire passes through the second cable hole, the third cable hole and the first cable hole and is connected to the main circuit board.

19. The cable management structure of claim 11, wherein the fixed assembly comprises a mounting plate and an auxiliary support, the mounting plate is connected to a top of the auxiliary support, the mounting plate defines a first connection hole, the auxiliary support defines a second connection hole, the rotating member comprises a cylindrical body, a first bearing and a second bearing, a top of the cylindrical body is fixedly connected to the rotating assembly, an inner ring of the first bearing is interference fit with the cylindrical body, an outer ring of the first bearing is interference fit with the first connection hole, an inner ring of the second bearing is interference fit with the cylindrical body, and an outer ring of the second bearing is interference fit with the second connection hole.

20. The cable management structure of claim 11, wherein the waist structure further comprises a driving assembly that is configured to drive the rotating assembly to rotate with respect to the fixed assembly, the driving assembly is arranged between the mounting plate and the auxiliary support, and comprises a drive gear and a drive device configured to drive the drive gear to rotate, and the rotating member comprises an outer gear section that is engaged with the drive gear.

* * * * *